us005895222A

United States Patent [19]

Moden et al.

[11] Patent Number: 5,895,222
[45] Date of Patent: Apr. 20, 1999

[54] ENCAPSULANT DAM STANDOFF FOR SHELL-ENCLOSED DIE ASSEMBLIES

[75] Inventors: Walter L. Moden, Meridian; John O. Jacobson, Boise, both of Id.

[73] Assignee: Micron Technology, Inc., Boise, Id.

[21] Appl. No.: 08/891,279

[22] Filed: Jul. 10, 1997

Related U.S. Application Data

[62] Division of application No. 08/646,778, May 8, 1996.
[51] Int. Cl.⁶ .......................... H01L 21/52; H01L 21/56; H01L 21/58; H01L 21/60
[52] U.S. Cl. .......................... 438/4; 438/690; 438/691; 438/940; 438/977
[58] Field of Search ...................... 438/4, 690, 691, 438/940, 977, FOR 434, FOR 485

[56] References Cited

U.S. PATENT DOCUMENTS

| | | |
|---|---|---|
| 4,598,308 | 7/1986 | James et al. . |
| 4,709,301 | 11/1987 | Yamaguti . |
| 4,897,508 | 1/1990 | Mahulikar et al. . |
| 4,961,106 | 10/1990 | Butt et al. . |
| 5,019,892 | 5/1991 | Grabbe . |
| 5,130,889 | 7/1992 | Hamburgen et al. . |
| 5,173,766 | 12/1992 | Long et al. . |
| 5,397,857 | 3/1995 | Farquhar et al. . |
| 5,399,805 | 3/1995 | Tyler et al. . |
| 5,436,203 | 7/1995 | Lin . |
| 5,455,456 | 10/1995 | Newman . |
| 5,463,531 | 10/1995 | Choon et al. . |
| 5,469,332 | 11/1995 | Alvité . |
| 5,475,919 | 12/1995 | Wu et al. . |
| 5,481,434 | 1/1996 | Banakis et al. . |
| 5,490,891 | 2/1996 | Farquhar et al. . |
| 5,690,773 | 11/1997 | Fidalgo et al. . |

Primary Examiner—David Graybill
Attorney, Agent, or Firm—Trask, Britt & Rossa

[57] ABSTRACT

An electronic device includes at least one chip connected to a circuit board. The chip includes a die and an encapsulant which is applied in a liquid phase and dries to a solid phase. A shell may be positioned over the chip and in some embodiments of the invention extends over the entire device. A dam is connected to the circuit board adjacent the die in at least one direction so as to restrain flow of the encapsulant toward the dam when the encapsulant is in the liquid phase. The dam may include an upper end at an elevation higher than the uppermost portion of the chip (which would usually be encapsulated), the dam acting as a standoff between the shell and the chip. The upper end of the dam may be constantly in contact with the shell or, alternatively, the upper end of the dam may be ordinarily not in contact with the shell, but comes into contact with the shell if the shell is compressed or flexed toward the chip. A single dam may surround the die (and chip structure after the encapsulant dries). Alternatively, a single dam may be adjacent to a die in less than all directions. Two or more chips may be adjacent to different sections or sides of a single dam.

21 Claims, 6 Drawing Sheets

ENCAPSULANT DAM STANDOFF FOR SHELL-ENCLOSED DIE ASSEMBLIES

This is a division of application Ser. No. 08/646,778, filed May 8, 1996, pending.

BACKGROUND OF THE INVENTION

1. Field of the Invention

The invention relates to the use of dams on printed circuit boards (PCB), in for example, PCMCIA PC cards, single in-line memory modules (SIMMs), and dual-in-line memory modules (DIMMs), as well as multi-chip modules (MCMs) in general. The dams may act as both a restraint or container for a liquid or gel encapsulant for chips, and as a standoff to support the card's shell to prevent the shell from contacting the chips or other portions of the PCB.

2. State of the Art

The Personal Computer Memory Card International Association (PCMCIA) defines standards for "credit card" sized "PC cards." The PC cards are widely used and typically perform memory and/or input/output (I/O) functions. PCMCIA standard PC cards have a standard length and width of 85.6 mm (3.370") and 54.0 mm (2.126"). However, the thickness varies depending on the "types" of card. Type 1 has a thickness of 3.3 mm (10.130"); Type 2 has a thickness of 5.0 mm (0.197"); and Type 3 has a thickness of 10.5 mm (0.413").

Referring to FIGS. 1A and 1B, a PC card 10 includes a card shell 14 and a built-in connector 18. Shell 14 is formed as an upper surface or section 22A and a lower surface or section 22B that are glued, welded, or otherwise affixed to each other, along an edge 24. Upper section 22A includes an extended planar portion 26A and lower section 22B includes an extended planar portion 26B.

Referring to FIG. 2A, in operation, PC card 10 is connected through connector 18 to a socket 30. PC cards are commonly used with portable computers (such a laptop, notebook, and sub-notebook computers), and in connecting various peripherals to a desk-top computer. In FIG. 2A, dashed lines represent a host system 34 (which could be a portable computer or peripheral interface) into which PC card 10 may be inserted. In FIG. 2A, PC card 10 is shown with an optional RJ-11 plug, which is used in connection with many PC cards.

Socket 30 is connected to a PCMCIA host bus adapter 38 through a PCMCIA socket interface 40. Host bus adapter 38 may be controlled in part through enabling software 44 (such as configuration and event notification software and run-time software) that is outside the scope of the present invention. Data passes between host bus adapter 38 and a host system controller 48 through a host bus 50. Host system controller 48 typical contains a microprocessor and various other electronic components.

Referring to FIG. 2B, host system 34 may be connected to a peripheral device 36, such as a printer or remote computer (which may contain its own PC card).

In FIG. 3, upper section 22A is separated from lower section 22B to illustrate the internal structure of PC card 10. Referring to FIG. 3, a printed circuit board (PCB) 54 is positioned in a "substrate area" 56 of lower section 22B. Connector 18, positioned in an "interconnect area" 60 of lower section 22B, communicates with components on PCB 54 through a bus 64. For purposes of illustration, chips 68, 70, 72, 74, and 76 are shown on PCB 54, although there may be many more chips or other components.

Upper and lower sections 22A and 22B are somewhat rigid. However, when a sufficient force is applied, upper and/or lower sections 22A and 22B, and particularly portions 26A and 26B, will flex or compress toward PCB 54. In such an event, there is some significant chance that upper and/or lower portions 26A and 26B will short out or otherwise damage components carried on PCB 54. Shorting out or otherwise damaging components is, of course, undesirable.

Typically, an electrical "chip" includes a semiconductor die that is wire bonded or otherwise electrically connected to a circuit board or lead frame and an encapsulant that surrounds and protects the die and wires. Encapsulants have been made of plastic in various forms, including transfer-molded packages as well as glob top or gel masses.

Filled epoxy resins are commonly used polymeric materials for leadframe-based device encapsulation by transfer molding. The molded encapsulant protects the die and wires and inner lead fingers from unfavorable mechanical, chemical, electrical, and thermal environments. Reasons for encapsulation include to insulate and isolate adjacent conductors (bond wires) from each other, to improve the vibration and shock resistance of the assembly, to provide mechanical rigidity to the assembly, to provide protection from atmospheric pollution, and to shrink the device size below that obtainable with preformed ceramic or metal packages. Because of their good dimensional tolerances, plastic packages are suitable for mechanized assembly. A deficiency of such polymer-encapsulated chips is that water will readily permeate even hydrophobic polymers. Therefore, a significant reliability issue in using plastic encapsulated chips is moisture-induced failures, including metallization corrosion. See Electronic Materials Handbook, Vol. 1 Packaging, ASM International, 1989, p. 802–03; Microelectronics Packaging Handbook, Edited R. Tummala et al., 1989, Van Nostrand Reinhold, pp. 760–61.

Merely as an example, the construction of a plastic-encapsulated DIP is now described. First, the semiconductor die is attached to the lead frame. Second, wirebonding is performed between the bond pads on the die and the corresponding leads. Third, transfer molding is used is used for plastic encapsulation. Fourth, the leads are trimmed, formed and solder coated. The die can sometimes be conformally coated with special polymeric substances prior to the transfer molding to impart additional protection from external moisture and from stresses caused by the molding operation and protection from thermal contraction mismatches. See Microelectronics Packaging Handbook, Edited R. Tummala et al., 1989, Van Nostrand Reinhold, pp. 760–61.

A glob top encapsulant refers to another type of polymer-encapsulated "package" in which the chip is attached to a conventional laminated, ceramic or silicon substrate with the polymeric encapsulant dispensed over it as a "glob top." These packages may be additionally enclosed under a cover sealed with polymer. A glob top encapsulant is usually a highly viscous liquid or paste that encapsulates either a microelectronic device directly mounted on a printed wiring board or a hybrid assembled on a substrate (ceramic board). Glob tops may be filled thermoset plastics. They are based primarily on epoxy or silicone technology and contain an inorganic filler or fillers. To reduce entrapment of air and to improve uniformity of compositions, a glob top encapsulant that generally comprises both resin and hardener parts may be prepared under reduced pressure with high shear mixing.

A desirable glob top encapsulant may desirably possess all of the following characteristics: (1) balanced viscosity, thixotropy and resistance to bleed at typical application and curing temperatures; (2) quick curing without void formation; (3) a low level of potentially leachable ionic contaminants; (4) mechanical strength and low-stress performance with an appropriate glass transition temperature; (5) moisture resistance and hydrophobicity; (6) compatibility with and proper adhesion to adjacent objects including substrate board, chip surface, and electroconductive circuitry; (7) desirable heat dissipation thermal conductivity (8) batch-to-batch consistency of performance and quality; and (9) good electrical insulative properties. See Electronic Materials Handbook, Vol. 1 Packaging, ASM International, 1989, p. 803; Microelectronics Packaging Handbook, Edited R. Tummala et al., 1989, Van Nostrand Reinhold, p. 761.

Unconstrained glob top encapsulants are commonly employed in the art. That is to say, the encapsulant is literally applied as a "glob" to the die, and permitted to expand laterally until surface tension and viscosity naturally limit its spread under gravity. Such an approach may be wasteful of material, and may result in board areas being coated which are intended to be left clear. Furthermore, use of an unconstrained glob top requires a greater mass of encapsulant to ensure coating of the wire bonds and die to an adequate depth, the latter being somewhat difficult to predict. Furthermore, the use of unconstrained encapsulants limits their use to fairly thick or viscous materials, which may include undesirable voids from trapped air (notwithstanding the use of high shear mixing techniques as described above), and to materials which actually dry, set or cure to a stable-dimensioned mass. Thus, the use of non-curing gels, which may be desirable in some circumstances for ease of failure analysis and rework, is excluded.

Dam structures have been developed to limit lateral encapsulant spread. See U.S. Pat. No. 5,436,203 to Lin. However, Lin's dam structures provide, little if any, physical protection from adverse contact by other package elements, and are intended to be employed solely with encapsulants which set or dry to a dimensionally stable mass.

SUMMARY OF THE INVENTION

The present invention involves an electronic device including at least one chip connected to a circuit board. The term "circuit board" includes laminated, ceramic and silicon substrates and other carriers supporting dice on a planar surface as known in the art. The chip may be said to include a die and an encapsulant which is applied in a liquid phase, and optionally dries, sets or cures to a solid phase. A shell or cover is positioned over the chip and may extend over the entire device. A dam (such as a wall or fence) is connected to the circuit board adjacent the die to protrude transversely therefrom in at least one direction so as to restrain flow of the encapsulant past the dam when the encapsulant is in the liquid phase. The dam may extend to an elevation higher than the uppermost portion of the chip (which would usually be encapsulated), whereby the dam acts as a standoff between the chip and the shell (or another component or element connected to it). Accordingly, a single dam member may both restrain flow of encapsulant and act as a standoff between the shell and the chip, thereby protecting components on the circuit board.

The upper end the dam may be constantly in contact with the shell or, alternatively, the upper end of the dam may not be ordinarily in contact with the shell, but comes into contact with the shell if the shell is deflected sufficiently toward the chip.

A single dam may surround a die or dice. Alternatively, a single dam may lie adjacent to a die in less than all directions. Two dam surfaces may share, or be defined by, a single wall. The upper elevation of the dam may include multiple sections (e.g. two, three, or four) that extend above the uppermost portion of the chip. The dams may include one or more discrete protrusions above an upper wall surface. One or more dams may surround multiple chips or the entire circuit board so that one application of encapsulant may cover multiple chips. The shell may include an inlet hole through which the encapsulant is applied, and a vent hole for the displacement of air in the chamber defined by the dams and shell. The shell may be positioned over the entire circuit board or only a portion of it.

The device (board and die or dice) may be a PCMCIA PC card, a SIMM, a DIMM, a flash memory, or any of various other electronic devices. Generally, the device will comprise a multi-chip module (MCM) including a plurality of dice having either the same or complementary functions. The device may include a computer and/or peripheral device to which the circuit board is connected and with which the chip communicates.

The dam may be directly or indirectly connected to the circuit board through an adhesive or other technique, may be formed on the board as by casting, or may be integrally formed therewith.

The encapsulant may be any of various kinds, including a curable glob top encapsulant and/or a gel encapsulant which remains in an uncured state after application.

The device may be assembled by connecting the dam to the circuit board. The dam may be connected before or after the die is connected. The dam is connected to the circuit board adjacent the die location or locations of interest. Bond wires are connected between the circuit board and the bond pads of the die, or the die may include conductive balls or bumps of solder or a conductive polymer to effect a face-down or "flip-chip" connection to the board. The encapsulant may be applied in a liquid or gel phase to the die, the dam restraining lateral flow of the encapsulant.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 4A:
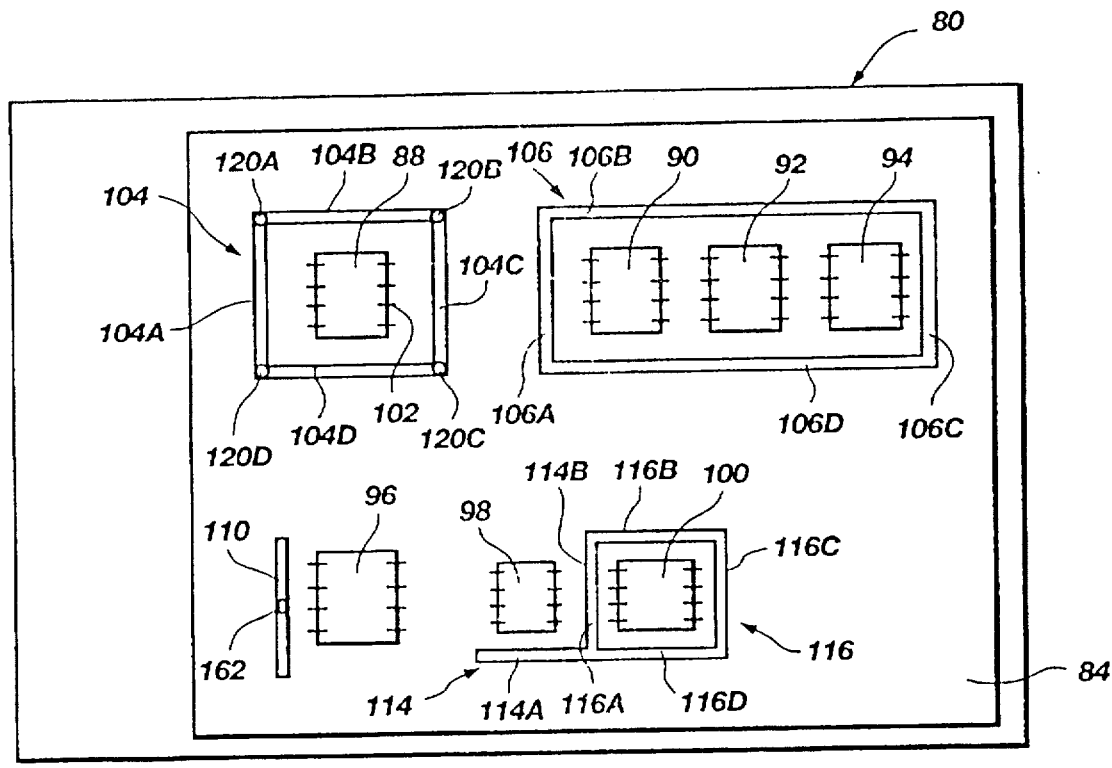
FIG. 4A is a top sectional view of an electronic device according to the present invention prior to the application of an encapsulant.
Figure 4B:
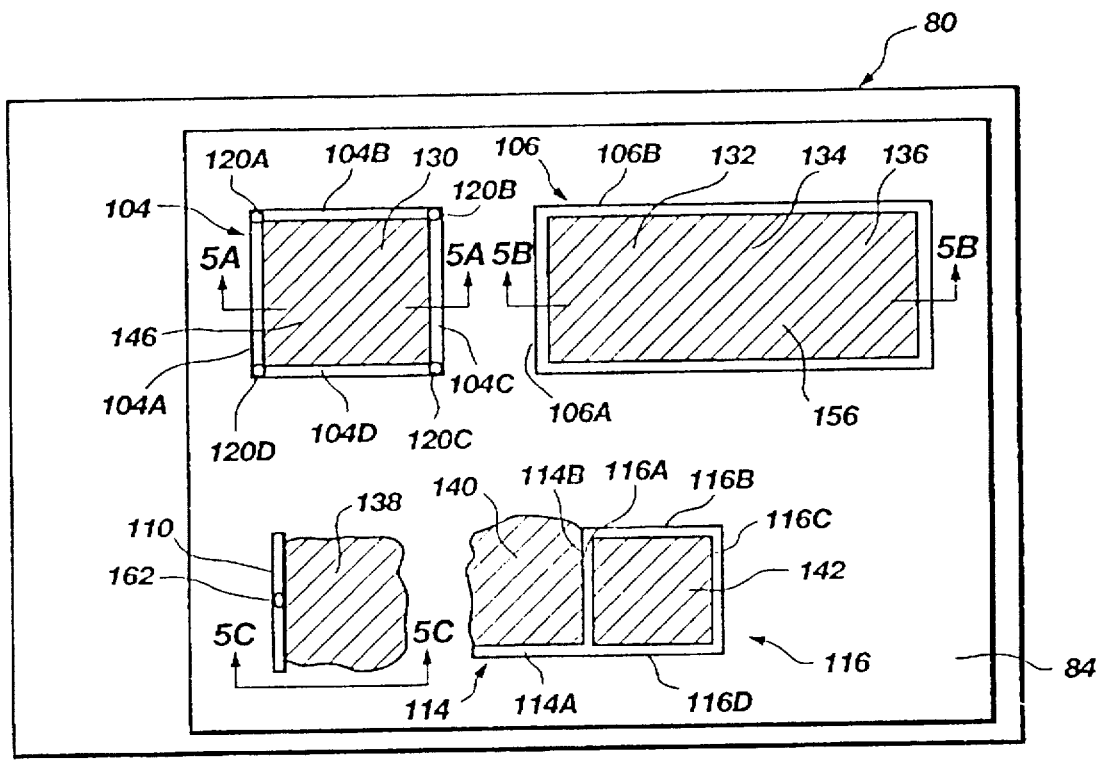
FIG. 4B is a top sectional view of an electronic device according to the present invention following the application of an encapsulant.

FIG. 4A shows a top sectional view of an electronic device 80 (which may be a PC card) before encapsulants are applied. A shell (not shown in FIG. 4A) may fit over all or part of electronic device 80. FIG. 4B shows the top sectional view of FIG. 4A after encapsulants have been applied to define encapsulated chips 130, 132, 134, 136, 138, 140, and 142.

Referring to FIG. 4A, electronic device 80 includes a circuit board 84 (which may be a printed circuit board such as an FR4 board, a ceramic or silicon substrate, or any other carrier structure known in the art to which the invention may be applied) to which dice 88, 90, 92, 94, 96, 98, and 100 are connected. The dice may be connected by their back sides to circuit board 84 through die-attach adhesives as known in the art. Dams 104, 106, 110, 114, and 116 are connected to, or formed on or with, circuit board 84 in various configurations to illustrate various embodiments of the invention. The dams are preferably made of non-conductive (dielectric) material and may comprise a preformed thermoplastic or a thermoset elastomer.

Depending on the application, the relative size of dice and dams shown in FIGS. 4A and 4B may be exaggerated for purposes of illustration. Also, certain components in PC cards have not been illustrated to facilitate uncluttered illustration. Dice 88–100 include connections to circuit traces (not shown) on circuit board 84 of which wire bonds 102 of die 88 may be representative.

Figure 5A:
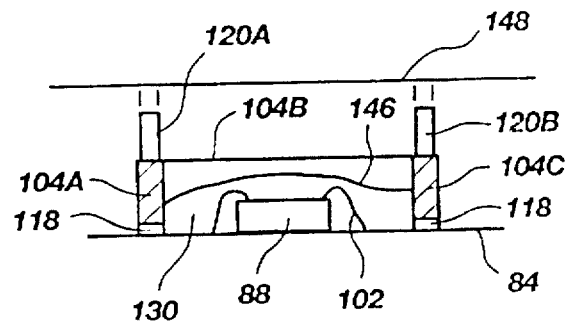
FIG. 5A is a cross-sectional side view of a first embodiment of the present invention in FIG. 4B.
Figure 5B:
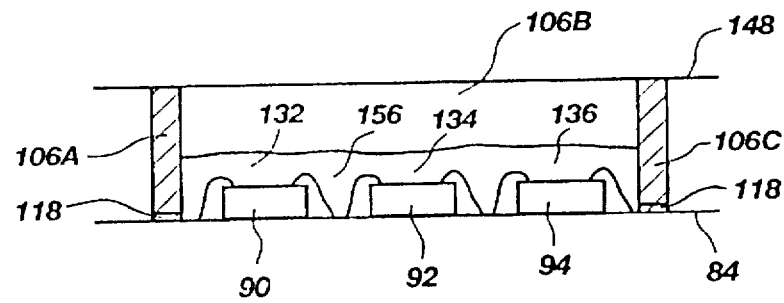
FIG. 5B is a cross-sectional side view of a second embodiment of the present invention in FIG. 4B.
Figure 5C:
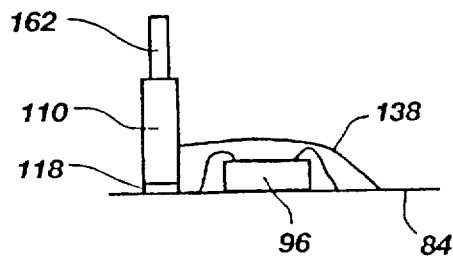
FIG. 5C is a cross-sectional side view of a third embodiment of the present invention in FIG. 4B.

FIGS. 5A, 5B, and 5C show side views as indicated by section lines in FIG. 4B.

Referring to FIG. 5A (in connection with FIGS. 4A and 4B), die 88 is connected to circuit board 84. Sections 104A, 104B, and 104C of dam 104 are connected to circuit board 84 through a non-conductive adhesive 118. Adhesive 118 may be various materials known in the art, including without limitation a silicone adhesive or an acrylic adhesive and may be applied to the underside of dam 104 or to the surface of circuit board 84. Adhesive 118 may be screen printed, rolled on, sprayed on, or applied in any other manner known in the art. An encapsulant 148 is then applied over die 88 with board 84 in a horizontal orientation and to envelope die 88 and the associated wire bonds, of which wire bond 102 is representative, to form encapsulated chip 130. Dam sections 104A, 104B, 104C, and 104D restrain the lateral flow of encapsulant 146, which may be applied in a liquid or gel form and dry, set or cure to a solid form.

An advantage to using dams is that the encapsulant may be readily applied at the end of the assembly process and cure while awaiting transport. Further, no finishing is required. The encapsulant may be applied quickly and in volumes with substantial tolerances because the dams will prevent encapsulant lateral spread beyond desirable bounds. Finally, no large capital investment, as in the case of transfer molding, is required.

Figure 1A:
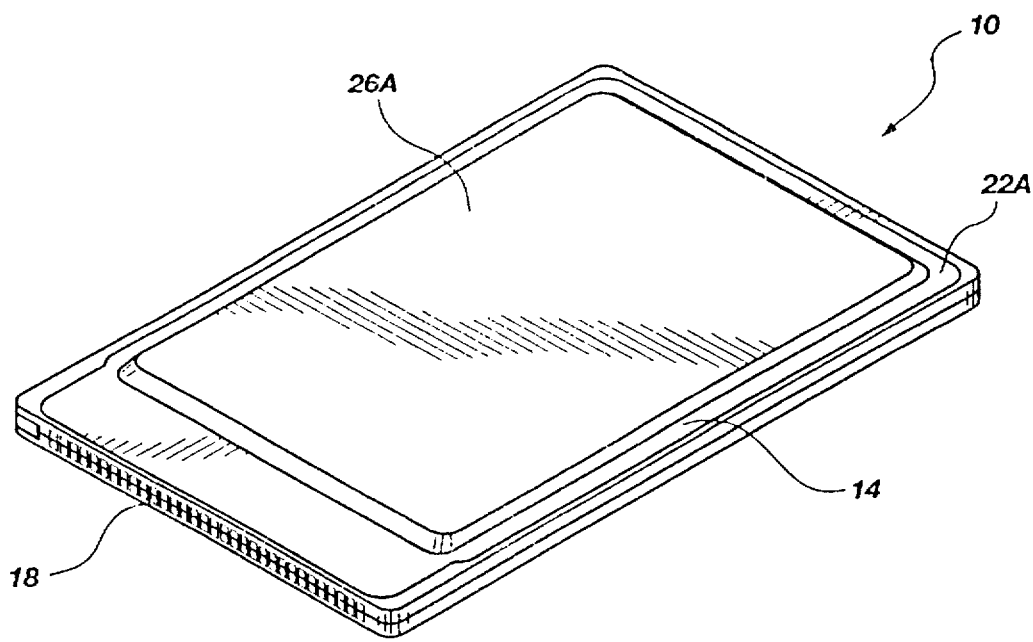
FIG. 1A is a perspective view of a prior art PC card.
Figure 1B:
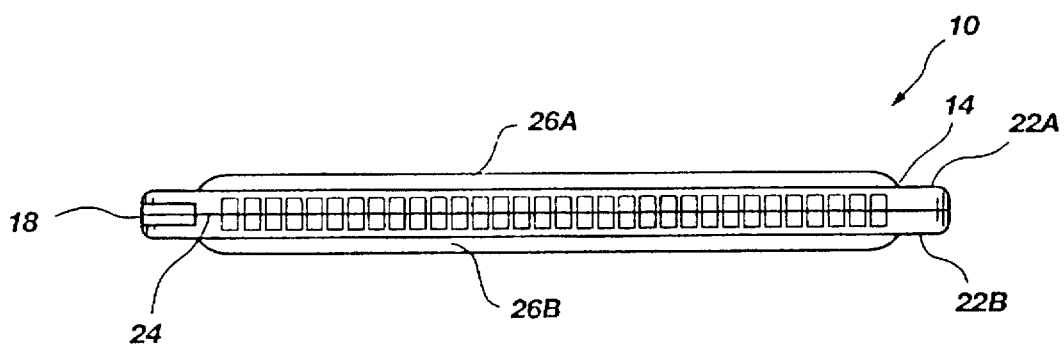
FIG. 1B is a side view of the PC card of FIG. 1.
Figure 2A:
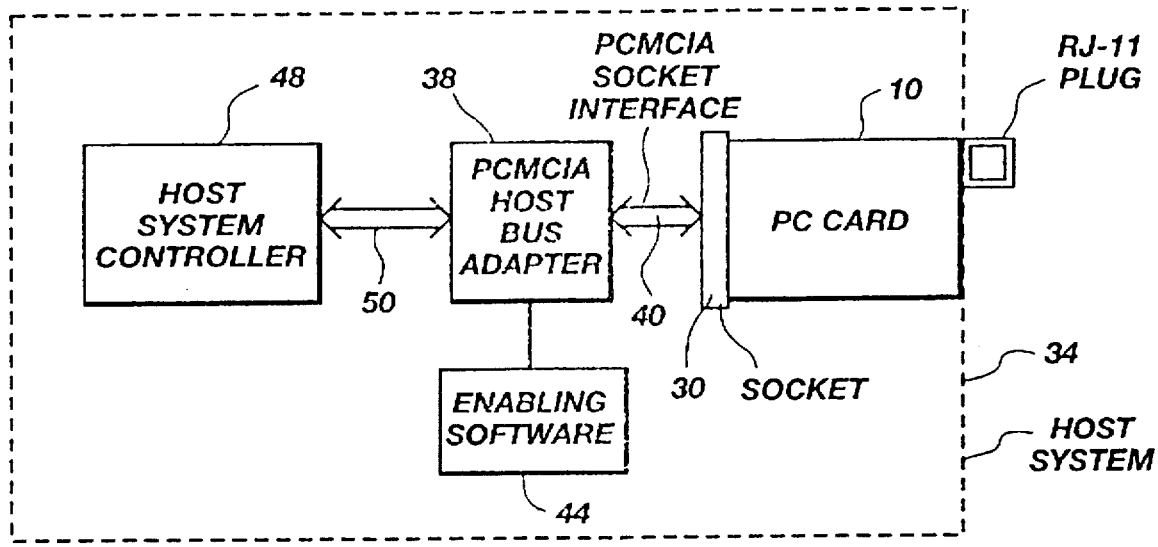
FIG. 2A is a schematic block diagram representation of a PC card in an exemplary prior art host system.
Figure 2B:
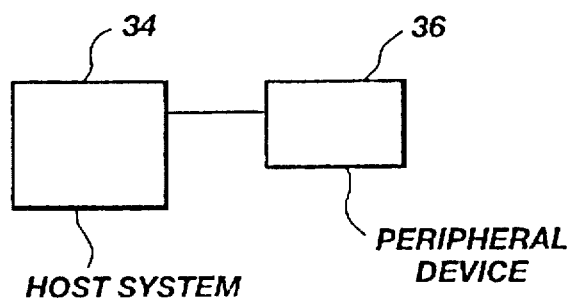
FIG. 2B is a schematic block diagram representation of the host system of FIG. 2A connected to a peripheral device.
Figure 3:
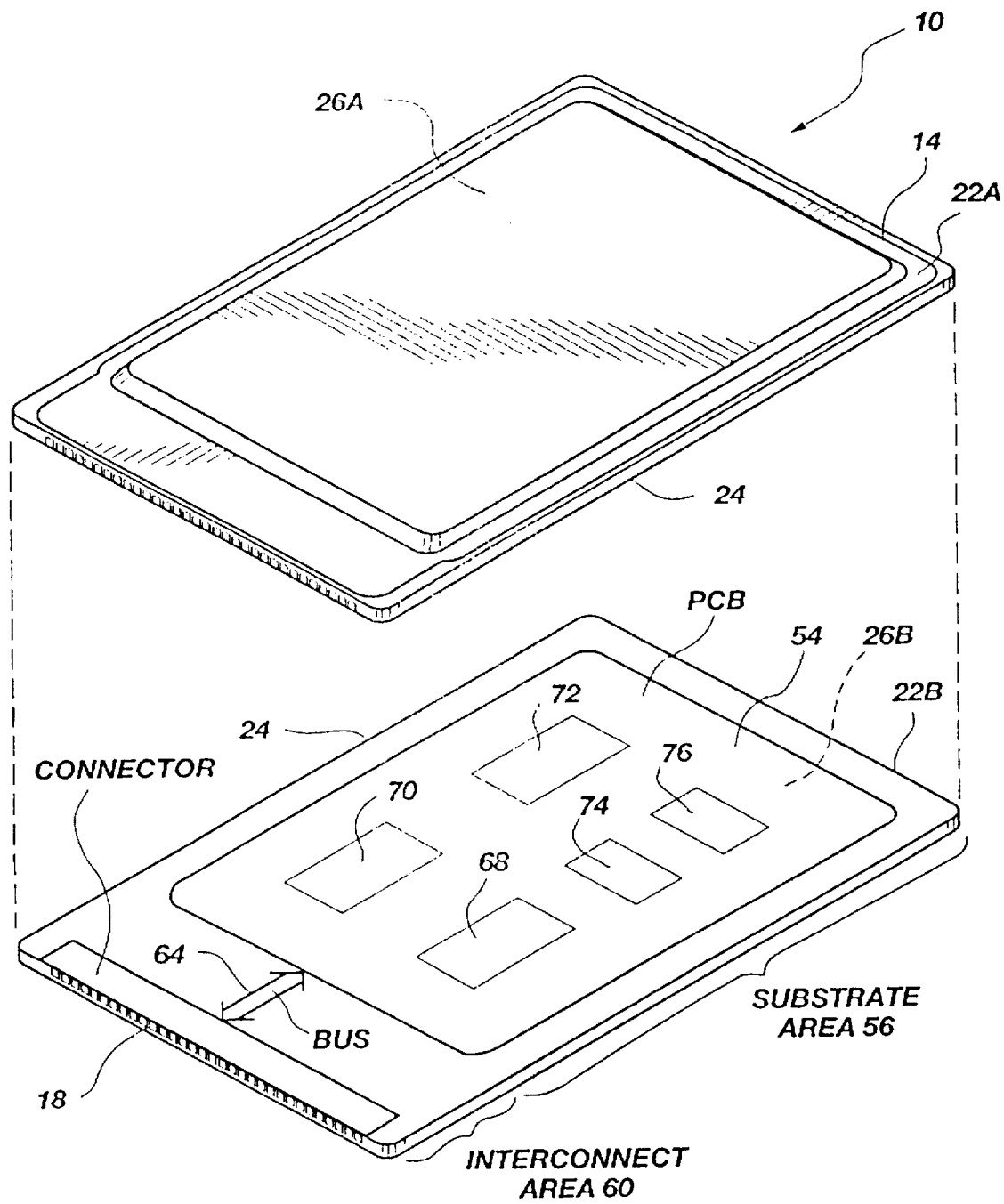
FIG. 3 is a partially exploded view of the PC card of FIG. 1.

Dam 104 includes upward protrusions 120A, 120B, 120C, and 120D at the corners thereof. A shell 148 which may be a cover to electronic device 80 corresponding to shell portions 26A or 26B of FIGS. 1A and 1B is connected (directly or indirectly) to a card structure in suspension over circuit board 84. As illustrated in FIG. 5A, shell 148 is ordinarily separated from and suspended over protrusions 120A, 120B, 120C, and 120D by its peripheral walls (see FIGS. 1A and 1B). However, when shell 148 is compressed or otherwise flexed transversely toward circuit board 84, protrusions 120A, 120B, 120C, and 120D act as columns or standoffs to limit the inward movement of shell 148 (or another element carried by shell 148), thus protecting chip 130 and various other surrounding components as well.

Alternatively, protrusions 120A, 120B, 120C, and/or 120D may be high enough (see broken lines) to constantly be in contact with shell 148. Moreover, dams without protrusions could be made tall enough to be in permanent contact with shell 148 so as to stop any downward movement of shell 148.

Referring to FIG. 5B, dice 90, 92, and 94 are attached to circuit board 84 and are surrounded by a single dam including dam sections 106A, 106B, 106C, and 106D. An encapsulant 156 is applied over dice 90, 92, and 94 and associated wires to produce encapsulated chips 132, 134, and 136. In the illustrated embodiment of FIG. 5B, dam 106 is high enough to be in permanent contact with shell 148. Of course, dam 106 may be shorter and still perform the encapsulant restraining and die protective functions. However, in this regard, another advantage of the embodiments of the invention wherein a dam or protrusions therefrom are in permanent contact with shell 148 (or something firmly connected thereto) is that such a design provides addition torsional and bending rigidity and support to the electronic device assembly.

Further, it is not necessary in all circumstances that a dam completely surround a die and encapsulant. For example, dams 110 and 114 provide retaining of encapsulant flow in some, but not all, lateral directions. Referring to FIG. 5C, dam 110 includes a single protrusion 162 at the center of dam 110. Of course, the protrusion may be included, but the invention does not require a protrusion. Further, more than one protrusion could have been used such as one at each end of dam 110.

Referring to FIG. 4B, a single wall can function as two dams. For example, dam sections 114B and 116A are defined by the same wall.

Figure 6:
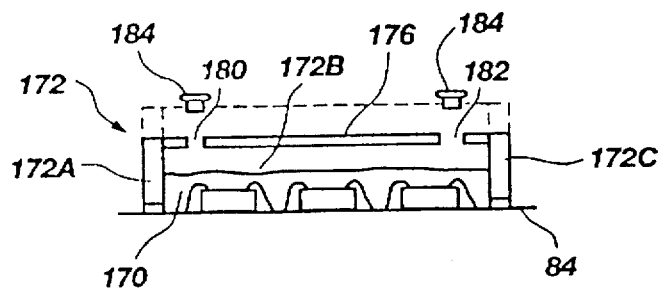
FIG. 6 is a cross-sectional side view of a fourth embodiment of the present invention.

Referring to FIG. 6, under an optional aspect of the invention, an encapsulant 170 is applied over dies completely bordered or surrounded by a dam 172 (of which dam sections 172A, 172B, and 172C are shown). A cover 178 (which could be but is not required to be shell 148) includes at least one input hole 180 into which encapsulant 170 is applied and at least one vent hole 182. Thus, an encapsulant might be poured into the compartment defined by dam 172 and cover 178 until encapsulant exhausts from the vent hole 180. If desired, encapsulant may be pumped under pressure (using a positive displacement pump to avoid air entrainment) into modules tilted with vent holes 182 elevated to promote venting of air. If a non-curing or setting encapsulant is employed, input holes 180 and vent holes 182 may be plugged with adhesive-coated or snap-in plugs 184. Alternatively, encapsulant 170 could be applied first, and then cover 178 (with or without holes) could be applied over it. Dam 172 could extend above cover 178 like a parapet wall (see broken lines), or include protrusions as previously described.

Figure 7:
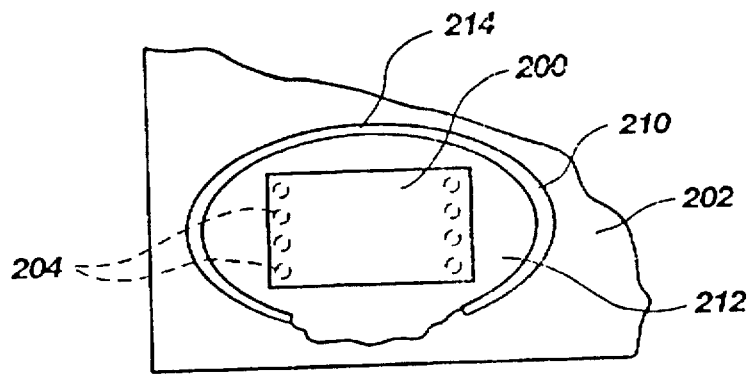
FIG. 7 is a top view of a glob-topped flip-chip bonded die partially surrounded by a curved or arcuate dam.

FIG. 7 depicts a die 200 disposed on a board 202, die 200 being flip-chip bonded (face down) to board 202 through a plurality of conductive balls or bumps 204 comprising solder or polymer with an electrically conductive capability. Flip chip connections mechanically and electrically connect dice to carriers, as is well known in the art. Curved dam 210 encompasses die 200 on three sides, the fourth side being open. An encapsulant 212 is disposed over die 200, flows under die 200 between die 200 and board 202 as an underfill. Board 202 may be tilted toward area 214 of wall to promote gravity-induced flow of encapsulant between die 200 and board 202 and around balls or bumps 204. The use of a curved wall may help preclude formation of air pockets adjacent the dam structure by eliminating corners.

Figure 8:
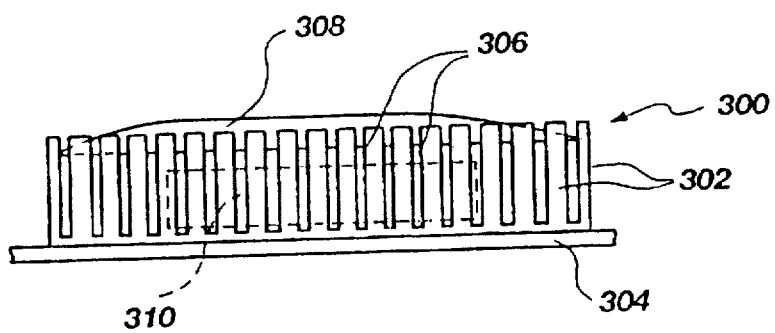
FIG. 8 is a side view of a perforated or stockade-type dam usable with viscous encapsulants.

FIG. 8 is a side view of a perforated discontinuous, picket fence or stockade embodiment of dam 300. Pickets or stakes 302 are employed in vertical disposition to board 304, and define apertures 306 therebetween. Pickets 302 may be joined at the bottom as shown, or at the top. Such structure may be used with a highly viscous encapsulant 308 over die 310 to conserve dam material and prevent entrapment of air between dam 300 and the encapsulant mass.

Figure 9:
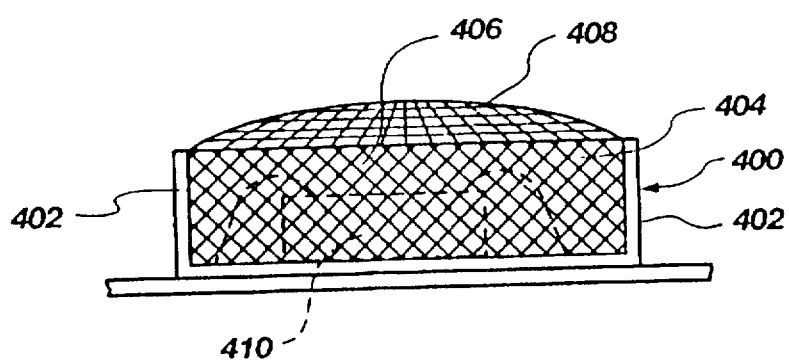
FIG. 9 is a side view of a mesh-type dam usable with viscous encapsulants.

FIG. 9 depicts a dam 400 comprising corner protrusions or standoffs 402 with a non-conductive mesh sheet 404 strung between them. As with the embodiment of FIG. 8, dam 400 is usable with an encapsulant 406 of relatively high viscosity so as not to extrude between the mesh apertures. Standoffs 402 may, as with other embodiments, be used to rigidify the electronic device assembly. Further, a mesh cover 408 may be used to constrain the encapsulant from the top, the use of mesh facilitating the flushing of air from around die 410. It is notable that a mesh enclosure (the term "mesh" including walls with a large percentage of void or aperture area) is suitable for use with a highly viscous but non-curing gel if the mesh apertures are sized appropriately.

It is not necessary that every dam include one or more protrusions or comprise a dam of sufficient height to provide shelter for underlying dice on a circuit board. The standoff functions of the dams may be accomplished with only one or more dams of sufficient height while other dams would have a shorter height and some components may not require an adjacent dam at all.

The encapsulants discussed herein are each identified by only a single reference numeral. However, that is not to suggest that they must comprise a single substance or be applied in a single step. Details regarding encapsulants are well known and are generally beyond the scope of the present invention. However, the following is noted.

A silicone gel is commonly used as an encapsulant for hostile, high-temperature environments, such as automotive engine compartments. It is a low stress, low hygroscopic properties material that is very effective for high corrosion and other harsh environments. Silicone gel tends to be less expensive than epoxy-type, glob-top materials. One disadvantage of silicones is they tend to poorly adhere to many substrates. However, the adhesion of silicones can be greatly enhanced with certain compounds that react with active sites on the substrate surface and, at the other end, link up with the silicone function groups. The glob top encapsulant may comprise one of many non-conductive epoxies known in the art, with a suitable filler for economic reasons.

Advantages of the invention include little or no board or module warpage due to no requirement for curing if a silicone gel is employed as the encapsulant. If an epoxy resin is used, curing is necessary, but the unconstrained nature of the glob top (at least one free side if a continuous perimeter dam is employed) and gradual nature of the cure process (in comparison to transfer-molding) as well as the fact that the glob-top is applied at ambient pressure rather than in a mold, all serve to reduce or eliminate the potential for adverse curing-induced stresses. Also, a continuous shell-contact dam standoff provides support for the shell and device case as a whole to stabilize the assembly during curing. Further, the invention has good application for high density packaging, the invention will work with flip chip or wire bond arrangements, it is easy to deprocess and perform failure analysis, the dams or walls provide raw (pre-encapsulation) IC and wire protection, and the invention permits the use of generic assembly equipment also usable for leadframe-based devices (e.g. die pick-and-place, wirebonders, etc.) for the package fabrication process.

A reduced-height dam (less than that of the enclosed die and wire bonds, if used) is facilitated by higher viscosity and surface tension of the selected encapsulant, which properties help prevent spread and result in a dome-shaped capsule.

Another significant advantage of the invention in comparison to the use of transfer-molded chip packages is that the dice may be tested and burned-in in the device prior to encapsulation.

For some embodiments, depending on the clearance needed by wirebond equipment, a dam may be positioned before or after wire-bonding. Positioning the dam before may be preferable, if sufficient clearance for wire bonding tools remains, as doing so physically protects the die during handling, burn-in and testing and before encapsulation.

As used in the claims, the terms "connect," "connectable," or "connected to" are not necessarily limited to a direct connection such as a flip-chip connection, but may include an indirect connection such as a wire bond, TAB (flex circuit) connections, or other intermediate conductive elements.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method of manufacturing an electronic device assembly, comprising:

providing a carrier having a die-attach surface with conductive traces disposed thereon;

placing at least one semiconductor die on said die-attach surface;

forming a dam adjacent said at least one die and including at least one segment extending upwardly from said die attach surface to a higher elevation than that of said at least one die plus an encapsulant to be placed thereover;

connecting said at least one die to said conductive traces; and applying an encapsulant over said at least one die in sufficient volume to abut at least a portion of said dam.

2. The method of claim 1, wherein forming said dam comprises preforming said dam and adhering said dam to said carrier.

3. The method of claim 1, wherein forming said dam comprises forming said dam on said carrier.

4. The method of claim 1, wherein forming said dam comprises forming said dam integrally with said carrier.

5. The method of claim 1, further including forming said dam laterally surrounding said at least one die and providing a cover to define a chamber between said cover, said dam and said carrier.

6. The method of claim 5, further comprising substantially filling said chamber with said encapsulant.

7. The method of claim 5, further including introducing said encapsulant into said chamber while venting said chamber.

8. The method of claim 1, further comprising suspending a shell over said at least one die.

9. The method of claim 8, further comprising contacting said shell with said at least one upwardly-extending segment.

10. The method of claim 1, further comprising curing said encapsulant.

11. The method of claim 1, further including electrically testing said at least one die prior to encapsulation.

12. The method of claim 1, further including electrically testing said at least one die subsequent to encapsulation.

13. The method of claim 12, further including removing at least a portion of said encapsulation subsequent to said electrical testing and removing said at least one die.

14. The method of claim 13, further including replacing said at least one die and connecting a replacement die to said conductive traces.

15. The method of claim 1, further comprising forming said dam on said carrier prior to connection of said at least one die to said conductive traces.

16. The method of claim 1, wherein said encapsulant is a non-curing encapsulant.

17. The method of claim 1, wherein said encapsulant is applied as a liquid.

18. The method of claim 1, wherein said encapsulant is applied as a gel.

19. The method of claim 1, wherein said connecting said at least one die is effected by a wire bonding, TAB bonding, or flip-chip bonding connection technique.

20. A method of manufacturing an electronic device assembly, comprising:

providing a carrier with conductive traces and having a die-attach surface;

placing at least one semiconductor die on said die-attach surface;

forming a perforated dam adjacent said at least one die and including at least one segment extending upwardly from said die attach surface to a higher elevation than that of said at least one die plus an encapsulant to be placed thereover;

connecting said at least one die to said conductive traces; and applying an encapsulant over said at least one die to abut, but not substantially pass through, at least a portion of said perforated dam.

21. The method of claim 20, further including placing a perforated cover over said at least one die and securing said cover to said dam, and wherein said encapsulant substantially fills a volume defined between said carrier, said dam and said cover.

* * * * *

UNITED STATES PATENT AND TRADEMARK OFFICE
CERTIFICATE OF CORRECTION

PATENT NO : 5,895,222
DATED : April 20, 1999
INVENTOR(S) : Moden et al.

It is certified that error appears in the above-identified patent and that said Letters Patent is hereby corrected as shown below:

On the Title Page, under "References Cited," add a subheading --Other Documents-- after the list of U.S. Patent Documents, and list the following references:

--Shinohara, Makoto, Encapsulants-Overview, Electronic Materials Handbook, Vol. 1, Packaging, ASM International (1989), pages 802-803.

Tummala, Rao R. and Eugene J. Rymaszewski, 10.7 Encapsulation,, Microelectronics Packaging Handbook, Van Nostrand Reinhold (1989), pages 760-761.--

| | | |
|---|---|---|
| Column 1, | line 11, | after "(PCB)" delete the comma and insert a comma after "in"; |
| Column 1, | line 39, | change "a" to --as--; |
| Column 2, | line 17, | change "leadframe-based" to --lead frame-based--; |
| Column 2, | line 41, | delete the first (1$^{st}$) occurrence of "is used"; |
| Column 3, | line 8, | change the comma after "circuitry" to a semicolon; |
| Column 3, | line 9, | insert a semicolon after "conductivity"; |
| Column 3, | line 17, | delete the comma after "die"; |
| Column 3, | line 35, | delete the comma after "provide" and insert a comma after "little"; |
| Column 3, | line 46, | delete the comma after "phase"; |
| Column 4, | line 9, | delete the comma after "applied"; |
| Column 5, | line 50, | change "148" to --146--; |
| Column 5, | line 51, | change "envelope" to --envelop--; |
| Column 5, | line 56, | change "dry" to --dried--, and change "cure" to --cured--; |
| Column 6, | line 49, | change "178" to --176--; |

UNITED STATES PATENT AND TRADEMARK OFFICE
CERTIFICATE OF CORRECTION

PATENT NO : 5,895,222
DATED : April 20, 1999
INVENTOR(S) : Moden et al.

It is certified that error appears in the above-identified patent and that said Letters Patent is hereby corrected as shown below:

| | | |
|---|---|---|
| Column 6, | line 54, | change "178" to --176--; |
| Column 6, | line 55, | change "180" to --182--; |
| Column 6, | line 62, | change "178" to --176--; |
| Column 6, | line 63, | change "178" to --176--; |
| Column 7, | line 6, | before "flows" insert --and--; |
| Column 7, | line 8, | change "wall" to --dam 210--; |
| Column 7, | line 13, | insert a comma after "perforated" and delete the comma after "discontinuous"; |
| Column 7, | line 15, | delete the comma after "304"; |
| Column 7, | line 21, | change "comer" to --corner--; |
| Column 7, | line 66, | insert a comma after "transfer-molding)"; |
| Column 8, | line 12, | change "leadframe-based" to --lead frame-based--; |
| Column 8, | line 25, | delete the comma after "preferable"; |

Signed and Sealed this

Twenty-sixth Day of December, 2000

Attest:

Q. TODD DICKINSON

*Attesting Officer*   *Director of Patents and Trademarks*